United States Patent [19]
Harpham et al.

[11] Patent Number: 6,140,884
[45] Date of Patent: Oct. 31, 2000

[54] INTEGRATED CIRCUITS FOR VOLTAGE CONTROLLED OSCILLATORS

[75] Inventors: Simon Lewis Harpham, Southampton; John Coulson James, Welwyn Garden, both of United Kingdom

[73] Assignee: Lucent Technologies Inc., Murray Hill, N.J.

[21] Appl. No.: 09/277,488

[22] Filed: Mar. 26, 1999

[30] Foreign Application Priority Data

Mar. 31, 1998 [EP] European Pat. Off. .............. 98302510

[51] Int. Cl.[7] ..................................................... H03B 5/00
[52] U.S. Cl. ............................... 331/117 R; 331/117 FE; 331/167; 331/175
[58] Field of Search ................................ 331/117 R, 111, 331/116 R, 116 FE, 117 FE, 117 D, 167, 175

[56] References Cited

U.S. PATENT DOCUMENTS

| | | | |
|---|---|---|---|
| 5,140,286 | 8/1992 | Black et al. | 331/99 |
| 5,434,544 | 7/1995 | Van Veenedaal | 331/117 R |
| 5,912,594 | 6/1999 | Burkhard | 331/116 R |

FOREIGN PATENT DOCUMENTS

| | | | |
|---|---|---|---|
| 94202503 | 9/1994 | European Pat. Off. | H03B 5/12 |
| 94402936 | 12/1994 | European Pat. Off. | H03B 5/12 |
| 96200152 | 1/1996 | European Pat. Off. | H03B 5/12 |
| 8902870 | 2/1989 | United Kingdom | H03B 1/04 |

OTHER PUBLICATIONS

European Search Report dated Sep. 2, 1998.

*Primary Examiner*—Robert Pascal
*Assistant Examiner*—Kimberly E Glenn
*Attorney, Agent, or Firm*—Julio A. Garceran

[57] ABSTRACT

An integrated circuit (shown below dashed line A—A) for a voltage controlled oscillator comprises a first transistor ($T_1$) having its collector coupled to a first port (Port 1) via a filter comprising a capacitor ($C_f$) and an inductor ($L_f$) and its emitter coupled to the emitter of a second transistor ($T_2$) whose collector is coupled to a second port (Port 2). The collector of the first transistor is also coupled via a capacitive divider ($C_1$, $C_2$) to the base of the second transistor. The base of the first transistor is AC decoupled ($C_3$). The emitters of the first and second transistors are fed by a current source ($I_1$). A capacitor ($C_s$) connects the base of the second transistor to the first port. The first and second ports are for connection to an external resonator ($L_1$, $D_1$, $C_p$, $L_p$) (shown above dashed line A—A) where $C_p$ and $L_p$ are parasitic capacitances and inductances respectively, the latter being typically bond wires connecting the ports to the rest of the external resonator. The filter ($C_f$, $L_f$) causes the circuit to exhibit negative impedance across the first and second ports. A VCO embodying the invention is tunable across the intended frequency range without exhibiting frequency hopping or mode switching.

6 Claims, 2 Drawing Sheets

INTEGRATED CIRCUITS FOR VOLTAGE CONTROLLED OSCILLATORS

CROSS-REFERENCE TO RELATED APPLICATION

This application claims priority of European Patent Application No. 98302510.7, which was filed on Mar. 31, 1998.

FIELD OF THE INVENTION

This invention relates to integrated circuits for voltage controlled oscillators (VCO).

BACKGROUND OF THE INVENTION

It is a common requirement, particularly in mobile handset design, for the various circuits involved to be as integrated as possible in order to reduce size, cost and weight. When, however, attempts have been made to integrate, or provide "on chip", a VCO using an external resonator, problems have arisen, particularly at UHF, of frequency hopping or mode switching. These problems arise because an integrated circuit package will always have associated parasitic inductance and capacitance associated with the external lead, lead frame and bond wires. It is possible for these parasitic components to dominate the on-chip components and so produce unwanted modes of oscillation. As the VCO gets close to the frequency at which the parasitic components resonate, the VCO may exhibit a tendency to hop to this frequency and become difficult to tune satisfactorily. An example of a known on-chip VCO will be described later.

Hitherto, it has been common practice to use a separate VCO module, but these use more expensive technology and packaging techniques. It is desirable to reduce the need for such external VCO modules, and thereby achieve a reduction in cost and increased reliability.

SUMMARY OF THE INVENTION

According to this invention an integrated circuit for a voltage controlled oscillator (VCO) comprises:
first and second ports for connection to an external resonator,
first and second transistors each having first and second controlled electrodes and a control electrode,
the first transistor having its first controlled electrode coupled via a filter to the first port, the resonant frequency of the filter being within the intended frequency range of the VCO,
the second transistor having its first controlled electrode coupled to the second port,
means for AC coupling the first controlled electrode of the first transistor to the control electrode of the second transistor,
the second controlled electrodes of the first and second transistors being coupled together and fed by a current source, and
means for decoupling the control electrode of the first transistor,
wherein, in operation, negative impedance is exhibited between the first and second ports.

Preferably there is provided a capacitor coupled between the control electrode of the second transistor and the first port, the capacitor forming, in operation, a series resonant circuit with the external resonator.

Preferably the AC coupling means comprises a capacitor forming part of a capacitive divider.

A VCO may comprise an integrated circuit according to the invention, and an external resonator coupled to the first and second ports. The external resonator may comprise a variable capacitance diode having a terminal for receiving a variable voltage for controlling the VCO frequency.

BRIEF DESCRIPTION OF THE DRAWINGS

The invention will now be described by way of example with reference to the accompanying drawings in which.

DETAILED DESCRIPTION

Figure 1:
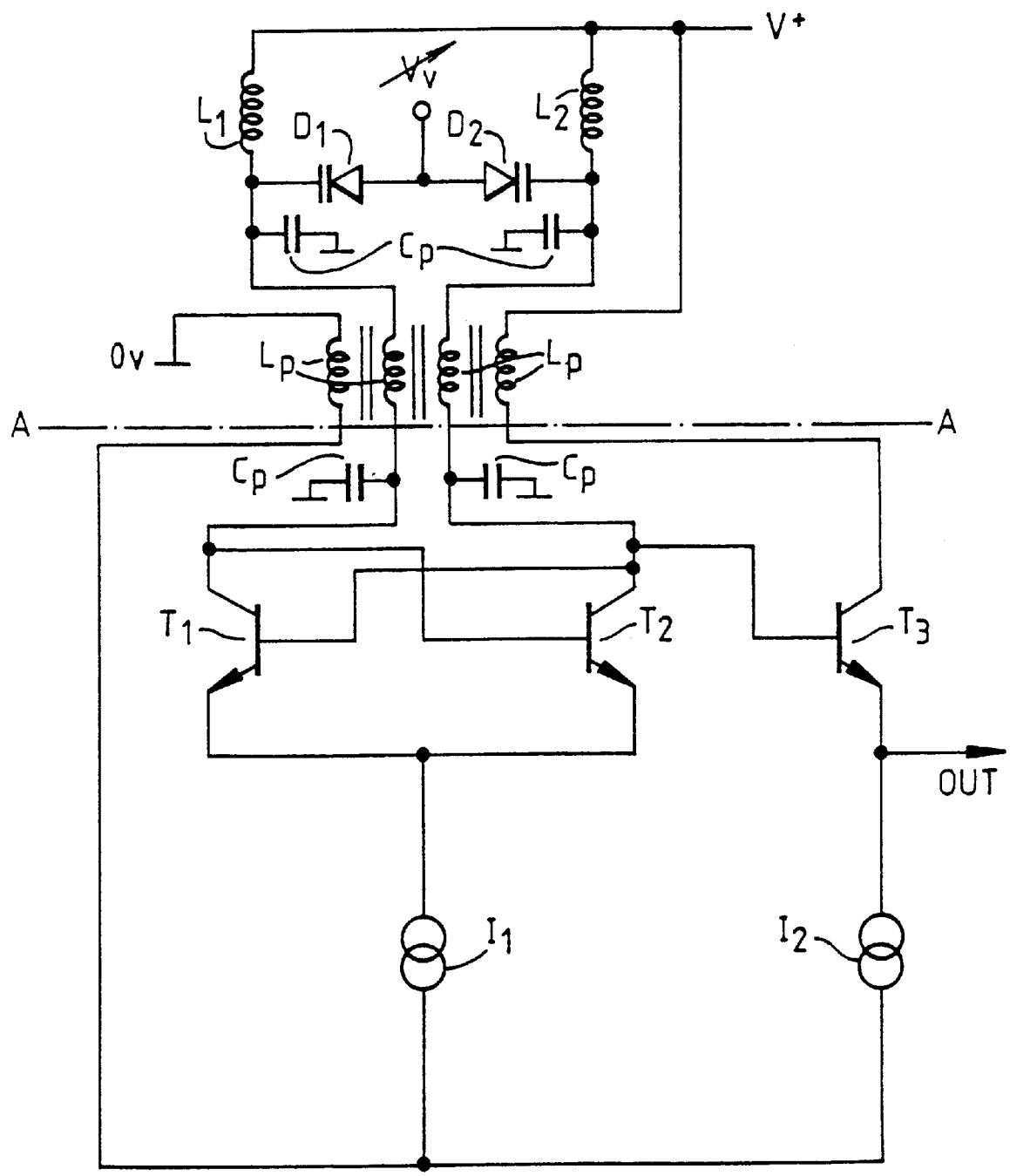
FIG. 1 is a schematic diagram of a known VCO circuit.

Referring now to FIG. 1, a known integrated VCO with an external resonator comprises on-chip components which are shown below the dashed line A—A, and an external resonator whose components are shown above the dashed line A—A. The integrated circuit, or on-chip, portion comprises cross-coupled transistors $T_1$ and $T_2$ whose emitters are coupled together and fed by a current source $I_1$, and whose collectors are coupled to the external resonator comprising inductors $L_1$, $L_2$, and $L_p$, variable capacitance diodes $D_1$ and $D_2$, and capacitors $C_p$. Capacitors $C_p$ in the external resonator and in the integrated circuit are parasitic capacitances, and inductors $L_p$ are parasitic inductances inherent, in this case, in the bond wires connecting the integrated circuit to the external resonator and power supply V+. The collector of $T_2$ is connected to the base of a transistor $T_3$ acting as a buffer and providing the VCO output at its emitter. As noted earlier, such a VCO tends to suffer from frequency hopping or mode switching due to the presence of the parasitics $C_p$ and $L_p$. In practice, this makes the VCO difficult to tune smoothly over its intended frequency range.

Figure 2:
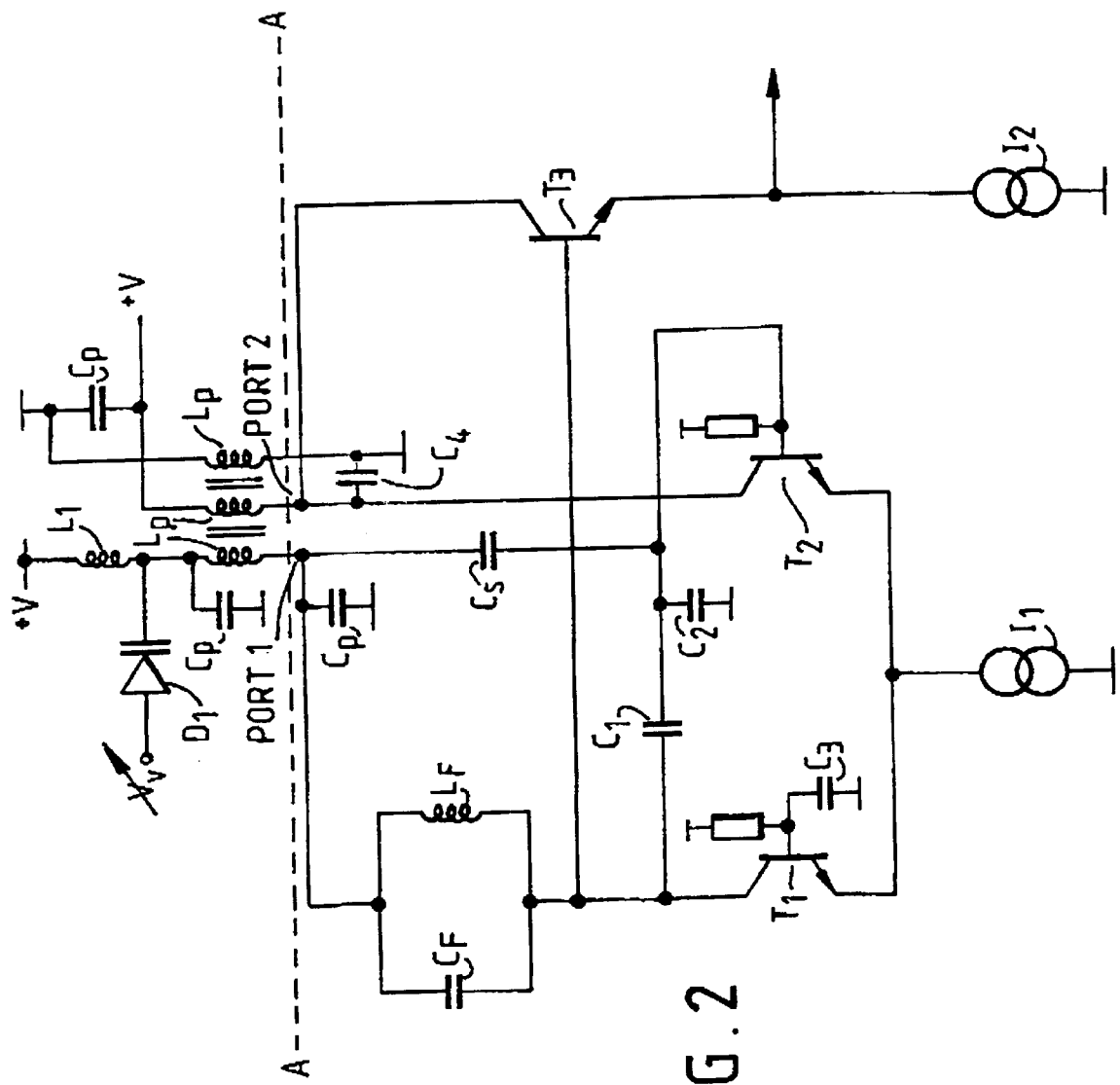
FIG. 2 is a schematic diagram of a VCO incorporating an illustrative embodiment of the invention.

Referring now to FIG. 2, a VCO comprises an integrated circuit shown below the dashed line A—A, and an external resonator shown above the dashed line A—A. The integrated circuit may of course contain many components (not shown) forming circuits which are not part of this embodiment of the invention and which will not be described. As in FIG. 1, capacitors $C_p$ are parasitic capacitances and inductors $L_p$ are parasitic inductances, in this case the inductances of the bond wires connecting the integrated circuit to the external resonator. A first transistor $T_1$ has its collector coupled to Port 1 of the integrated circuit via a filter comprising a capacitor $C_f$ and an inductor $L_f$ and whose resonant frequency is within, preferably at the centre of, the frequency range of the VCO. A second transistor $T_2$ has its collector coupled to Port 2 of the integrated circuit, and its emitter coupled to the emitter of $T_1$, both emitters being fed by a current source $I_1$. The collector of $T_1$ is coupled via a capacitive divider, comprising capacitors $C_1$ and $C_2$, to the base of $T_2$. The base of $T_1$ is decoupled by a capacitor $C_3$. A capacitor $C_s$ couples the base of $T_2$ to Port 1, capacitor $C_s$ forming a series resonant circuit with the external resonator. Port 2 is decoupled by a capacitor $C_4$. The collector of $T_1$ is also coupled to the base of a buffer transistor $T_3$ whose emitter provides the output of the VCO and is fed via a current source $I_2$.

The external resonator is connected to Ports 1 and 2 and comprises a variable capacitance diode $D_1$, an inductor $L_1$, e.g. a microstrip, and the various parasitic elements $C_p$ and $L_p$. Other forms of external resonator will of course occur to those skilled in the art.

In operation, the filter comprising capacitor $C_f$ and inductor $L_f$ causes the circuit to exhibit a negative impedance across ports 1 and 2. The circuit has been shown to be tunable over the intended frequency range and does not exhibit unwanted frequency hopping or mode switching.

Although the embodiment as shown and described uses bipolar transistors, it will be appreciated that other types of transistor device, e.g. FET devices may be used instead. Furthermore, the embodiment described with reference to FIG. 2 is purely illustrative and variations thereof will occur to those skilled in the art.

What is claimed is:

1. An integrated circuit for a voltage controlled oscillator (VCO) comprising:

first and second ports (Port 1, Port 2) for connection to an external resonator ($L_1$, $D_1$, $C_p$, $L_p$), first and second transistors ($T_1$, $T_2$) each having first and second controlled electrodes and a control electrode, the first transistor ($T_1$) having its first controlled electrode coupled via a filter ($C_f$, $L_f$) to the first port (Port 1), the resonant frequency of the filter being within the intended frequency range of the VCO, the second transistor ($T_2$) having its first controlled electrode coupled to the second port (Port 2), means ($C_1$) for AC coupling the first controlled electrode of the first transistor ($T_1$) to the control electrode of the second transistor ($T_2$), the second controlled electrodes of the first and second transistors being coupled together and fed by a current source ($I_1$), and means ($C_3$) for decoupling the control electrode of the first transistor, wherein, in operation, negative impedance is exhibited between the first and second ports.

2. An integrated circuit as claimed in claim 1 comprising a capacitor ($C_s$) coupled between the control electrode of the second transistor ($T_2$) and the first port (Port 1), the capacitor forming, in operation, a series resonant circuit with the external resonator.

3. An integrated circuit as claimed in claim 1 wherein the AC coupling means comprises a capacitor ($C_1$) forming part of a capacitive divider ($C_1$, $C_2$).

4. An integrated circuit as claimed in claim 1 comprising a buffer transistor, ($T_3$) having a control electrode coupled to the first controlled electrode of the first transistor, for providing output at a controlled electrode thereof.

5. A VCO comprising an integrated circuit as claimed in claim 1, and an external resonator ($L_1$, $D_1$, $C_p$, $L_p$) coupled to the first and second ports.

6. A VCO as claimed in claim 5 wherein the external resonator comprises a variable capacitance diode ($D_1$) having a terminal for receiving a variable voltage ($V_v$) for controlling the VCO frequency.

* * * * *